United States Patent
Sunshine et al.

(10) Patent No.: US 10,910,315 B2
(45) Date of Patent: Feb. 2, 2021

(54) FABRIC WITH EMBEDDED ELECTRICAL COMPONENTS

(71) Applicant: Apple Inc., Cupertino, CA (US)

(72) Inventors: Daniel D. Sunshine, Sunnyvale, CA (US); Paul S. Drzaic, Morgan Hill, CA (US); Daniel A. Podhajny, San Jose, CA (US); David M. Kindlon, Felton, CA (US); Hoon Sik Kim, San Jose, CA (US); Kathryn P. Crews, Menlo Park, CA (US); Yung-Yu Hsu, San Jose, CA (US)

(73) Assignee: Apple Inc., Cupertino, CA (US)

( * ) Notice: Subject to any disclaimer, the term of this patent is extended or adjusted under 35 U.S.C. 154(b) by 288 days.

(21) Appl. No.: 15/752,476

(22) PCT Filed: Aug. 10, 2016

(86) PCT No.: PCT/US2016/046260
§ 371 (c)(1),
(2) Date: Feb. 13, 2018

(87) PCT Pub. No.: WO2017/030851
PCT Pub. Date: Feb. 23, 2017

(65) Prior Publication Data
US 2019/0013274 A1 Jan. 10, 2019

Related U.S. Application Data

(60) Provisional application No. 62/207,521, filed on Aug. 20, 2015.

(51) Int. Cl.
*H05K 1/00* (2006.01)
*H01L 23/538* (2006.01)
(Continued)

(52) U.S. Cl.
CPC ........ *H01L 23/5387* (2013.01); *A41D 27/205* (2013.01); *B81B 7/007* (2013.01);
(Continued)

(58) Field of Classification Search
USPC ........................................................ 361/749
See application file for complete search history.

(56) References Cited

U.S. PATENT DOCUMENTS 7,144,830 B2   12/2006   Hill et al.
7,531,203 B2    5/2009   Tao et al.
(Continued)

FOREIGN PATENT DOCUMENTS

CN      1650057 A    8/2005
CN    101185175 A    5/2008
(Continued)

*Primary Examiner* — Andargie M Aychillhum
(74) *Attorney, Agent, or Firm* — Treyz Law Group, P.C.; G. Victor Treyz; Joseph F. Guihan

(57) ABSTRACT

A fabric-based item may include fabric such as woven fabric having insulating and conductive yarns or other strands of material. The conductive yarns may form signal paths. Electrical components can be embedded within pockets in the fabric. Each electrical component may have an electrical device such as a semiconductor die that is mounted on an interposer substrate. The electrical device may be a light-emitting diode, a sensor, an actuator, or other electrical device. The electrical device may have contacts that are soldered to contacts on the interposer. The interposer may have additional contacts that are soldered to the signal paths. The fabric may have portions that form transparent windows overlapping the electrical components or that have other desired attributes.

18 Claims, 14 Drawing Sheets

(51) Int. Cl.
*D03D 1/00* (2006.01)
*D03D 11/02* (2006.01)
*A41D 27/20* (2006.01)
*B81B 7/00* (2006.01)
*H01L 23/00* (2006.01)
*H01L 33/62* (2010.01)

(52) U.S. Cl.
CPC .......... *D03D 1/0088* (2013.01); *D03D 11/02* (2013.01); *H01L 23/5386* (2013.01); *H01L 24/16* (2013.01); *H01L 33/62* (2013.01); *A41D 2500/20* (2013.01); *B81B 2201/02* (2013.01); *B81B 2201/03* (2013.01); *D03D 2700/0166* (2013.01); *D10B 2401/16* (2013.01); *D10B 2401/18* (2013.01); *H01L 2224/16227* (2013.01); *H01L 2924/12041* (2013.01); *H01L 2924/1461* (2013.01)

(56) References Cited

U.S. PATENT DOCUMENTS

| | | | |
|---|---|---|---|
| 7,988,332 | B2 | 8/2011 | Lo et al. |
| 8,022,307 | B2 | 9/2011 | Chu et al. |
| 8,127,440 | B2 | 3/2012 | Douglas |
| 9,232,637 | B2 | 1/2016 | Van Abeelen et al. |
| 2003/0211797 | A1* | 11/2003 | Hill ................. H05K 1/189 442/205 |
| 2005/0029680 | A1 | 2/2005 | Jung et al. |
| 2006/0007059 | A1 | 1/2006 | Bell |
| 2007/0053179 | A1 | 3/2007 | Pang et al. |
| 2008/0196940 | A1 | 8/2008 | Stobbe et al. |
| 2008/0218369 | A1 | 9/2008 | Krans et al. |
| 2008/0233822 | A1 | 9/2008 | Swallow et al. |
| 2009/0027603 | A1 | 1/2009 | Samulski et al. |
| 2010/0065873 | A1 | 3/2010 | Bhattacharya et al. |
| 2010/0208445 | A1 | 8/2010 | Asvadi et al. |
| 2012/0250329 | A1 | 10/2012 | Suehiro et al. |
| 2012/0327654 | A1* | 12/2012 | Bhattacharya ........... D04B 1/14 362/235 |
| 2013/0333094 | A1* | 12/2013 | Rogers ................. A61B 5/7455 2/161.7 |
| 2015/0177436 | A1* | 6/2015 | Zimmermann .......... D03D 1/00 362/510 |
| 2015/0181692 | A1 | 6/2015 | Jezewski et al. |
| 2016/0058375 | A1 | 3/2016 | Rothkopf |
| 2016/0320037 | A1 | 11/2016 | Wong et al. |
| 2017/0038047 | A1 | 2/2017 | Golle et al. |
| 2017/0198900 | A1 | 7/2017 | Speier |

FOREIGN PATENT DOCUMENTS

| | | |
|---|---|---|
| CN | 101282834 A | 10/2008 |
| CN | 101827967 A | 9/2010 |
| CN | 102812506 | 12/2012 |
| CN | 104428457 A | 3/2015 |
| CN | 104662800 A | 5/2015 |
| EP | 2784198 A1 | 10/2014 |
| JP | 2013147767 A | 8/2013 |
| WO | 02/34019 A1 | 4/2002 |
| WO | 2004100111 A2 | 11/2004 |
| WO | 2006/129223 A1 | 12/2006 |
| WO | 2007/141726 A1 | 12/2007 |
| WO | 2008/007237 A2 | 1/2008 |
| WO | 2008/120134 A1 | 10/2008 |
| WO | 2010/032173 A1 | 3/2010 |
| WO | 2011/110974 A1 | 9/2011 |
| WO | 2015/103580 A2 | 7/2015 |

\* cited by examiner

FABRIC WITH EMBEDDED ELECTRICAL COMPONENTS

BACKGROUND

This relates generally to fabric-based items and, more particularly, to fabric-based items with embedded electrical components.

It may be desirable to form bags, furniture, clothing, and other items from materials such as fabric. Fabric-based items generally do not include electrical components. It may be desirable, however, to incorporate electrical components into a fabric-based item to provide a user of a fabric-based item with enhanced functionality.

It can be challenging to incorporate electrical components into a fabric-based item. Fabric is flexible, so it can be difficult to mount structures to fabric. Electrical components must be coupled to signal paths, but unless care is taken, signal paths will be damaged as fabric is bent and stretched.

It would therefore be desirable to be able to provide improved techniques for incorporating electrical components into fabric-based items.

SUMMARY

A fabric-based item may include fabric such as woven fabric having insulating and conductive yarns or other strands of material. The conductive yarns may form signal paths. Electrical components can be embedded within pockets in the fabric and may be electrically coupled to the signal paths. The fabric may have portions that form transparent windows, partially transparent windows, or translucent windows overlapping the electrical components or that have other desired attributes. Fabric that has been augmented by incorporating electrical components or other structures into the fabric may have an appearance and mechanical compliance that is similar to or identical to unmodified fabric. As a result, augmented fabric may not be noticeably different in appearance than unaugmented fabric to a person who is viewing or handling the fabric.

Each electrical component may have an electrical device such as a semiconductor die that is mounted on an interposer. The electrical device may be a light-emitting diode, a sensor, an actuator, or other electrical device. The electrical device may have contacts that are soldered to contacts on the interposer. The interposer may have additional contacts that are soldered to the signal paths. Metal traces in the interposer may couple the contacts to which the electrical device is coupled to the contacts to which the signal paths are coupled.

The interposer may be formed from a printed circuit such as a rigid printed circuit substrate layer or a flexible printed circuit substrate layer. A flexible printed circuit substrate layer may have serpentine arms that extend between a main portion of the substrate layer and contact pad support regions.

DETAILED DESCRIPTION

Figure 1:
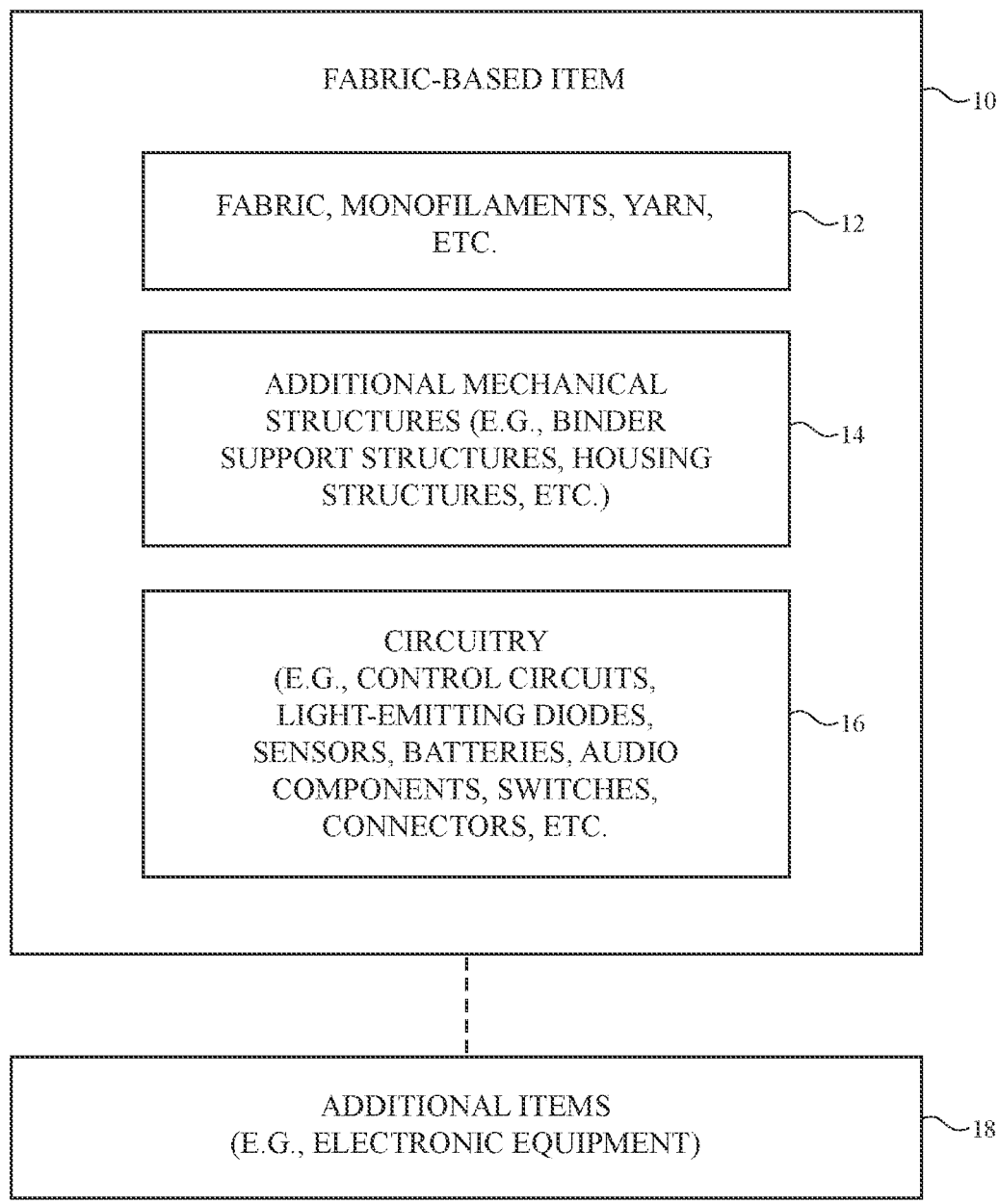
FIG. 1 is a schematic diagram of an illustrative fabric-based item in accordance with an embodiment.

Items such as item 10 of FIG. 1 may be based on fabric. Item 10 may be an electronic device or an accessory for an electronic device such as a laptop computer, a computer monitor containing an embedded computer, a tablet computer, a cellular telephone, a media player, or other handheld or portable electronic device, a smaller device such as a wrist-watch device, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which fabric-based item 10 is mounted in a kiosk, in an automobile, airplane, or other vehicle, other electronic equipment, or equipment that implements the functionality of two or more of these devices. If desired, item 10 may be a removable external case for electronic equipment, may be a strap, may be a wrist band or head band, may be a removable cover for a device, may be a case or bag that has straps or that has other structures to receive and carry electronic equipment and other items, may be a necklace or arm band, may be a wallet, sleeve, pocket, or other structure into which electronic equipment or other items may be inserted, may be part of a chair, sofa, or other seating (e.g., cushions or other seating structures), may be part of an item of clothing or other wearable item (e.g., a hat, belt, wrist band, headband, etc.), or may be any other suitable fabric-based item.

Item 10 may include intertwined strands of material such as monofilaments and yarns that form fabric 12. Fabric 12 may form all or part of a housing wall or other layer in an electronic device, may form internal structures in an electronic device, or may form other fabric-based structures. Item 10 may be soft (e.g., item 10 may have a fabric surface that yields to a light touch), may have a rigid feel (e.g., the surface of item 10 may be formed from a stiff fabric), may be coarse, may be smooth, may have ribs or other patterned textures, and/or may be formed as part of a device that has portions formed from non-fabric structures of plastic, metal, glass, crystalline materials, ceramics, or other materials.

The strands of material in fabric 12 may be single-filament strands (sometimes referred to as fibers) or may be yarns or other strands that have been formed by intertwining multiple filaments of material together. Examples of fabric 12 formed from yarn are sometimes described herein as an example. This is, however, merely illustrative. Yarn-based fabric for item 10 may, if desired, be partly or completely formed from monofilaments.

The yarns in fabric 12 may be formed from polymer, metal, glass, graphite, ceramic, natural materials as cotton or bamboo, or other organic and/or inorganic materials and combinations of these materials. Conductive coatings such as metal coatings may be formed on non-conductive material. For example, plastic yarns and monofilaments in fabric 12 may be coated with metal to make them conductive. Reflective coatings such as metal coatings may be applied to make yarns and monofilaments reflective. Yarns may be formed from a bundle of bare metal wires or metal wire intertwined with insulating monofilaments (as examples).

Yarn may be intertwined to form fabric 12 using intertwining equipment such as weaving equipment, knitting equipment, or braiding equipment. Intertwined yarn may, for example, form woven fabric. Conductive yarn and insulating yarn may be woven, knit, braided, or otherwise intertwined to form contact pads that can be electrically coupled to conductive structures in item 10 such as the contact pads of an electrical component.

Conductive yarn and insulating yarn may also be woven, knit, or otherwise intertwined to form conductive paths. The conductive paths may be used in forming signal paths (e.g., signal buses, power lines, etc.), may be used in forming part of a capacitive touch sensor electrode, a resistive touch sensor electrode, or other input-output device, or may be used in forming other patterned conductive structures. Conductive structures in fabric 12 may be used in carrying power signals, digital signals, analog signals, sensor signals, control signals, data, input signals, output signals, or other suitable electrical signals.

Item 10 may include additional mechanical structures 14 such as polymer binder to hold yarns in fabric 12 together, support structures such as frame members, housing structures (e.g., an electronic device housing), and other mechanical structures.

To enhance mechanical robustness and electrical conductivity at yarn-to-yarn connections, additional structures and materials (e.g., solder, crimped metal connections, welds, conductive adhesive such as anisotropic conductive film and other conductive adhesive, non-conductive adhesive, fasteners, etc.) may be used to help form yarn-to-yarn connections. These yarn-to-yarn connections may be formed where yarns cross each other perpendicularly or at other yarn intersections where connections are desired. Insulating material can be interposed between intersecting conductive yarns at locations in which it is not desired to form a yarn-to-yarn connection. The insulating material may be plastic or other dielectric, may include an insulating yarn or a conductive yarn with an insulating coating or insulated conductive monofilaments, etc. Solder connections may be formed between conductive yarns by melting solder so that the solder flows over conductive yarns. The solder may be melted using an inductive soldering head to heat the solder, using a reflow oven to heat the solder, using a laser or hot bar to heat the solder, or using other soldering equipment. During soldering, outer dielectric coating layers (e.g., outer polymer layers) may be melted away in the presence of molten solder, thereby allowing underlying metal yarns to be soldered together.

Circuitry 16 may be included in item 10. Circuitry 16 may include electrical components that are coupled to fabric 12, electrical components that are housed within an enclosure formed by fabric 12, electrical components that are attached to fabric 12 using welds, solder joints, adhesive bonds (e.g., conductive adhesive bonds such as anisotropic conductive adhesive bonds or other conductive adhesive bonds), crimped connections, or other electrical and/or mechanical bonds. Circuitry 16 may include metal structures for carrying current, electrical components such as integrated circuits, light-emitting diodes, sensors, and other electrical devices. Control circuitry in circuitry 16 may be used to control the operation of item 10 and/or to support communications with item 18 and/or other devices.

Item 10 may interact with electronic equipment or other additional items 18. Items 18 may be attached to item 10 or item 10 and item 18 may be separate items that are configured to operate with each other (e.g., when one item is a case and the other is a device that fits within the case, etc.). Circuitry 16 may include antennas and other structures for supporting wireless communications with item 18. Item 18 may also interact with item 10 using a wired communications link or other connection that allows information to be exchanged.

In some situations, item 18 may be an electronic device such as a cellular telephone, computer, or other portable electronic device and item 10 may form a cover, case, bag, or other structure that receives the electronic device in a pocket, an interior cavity, or other portion of item 10. In other situations, item 18 may be a wrist-watch device or other electronic device and item 10 may be a strap or other fabric-based item that is attached to item 18 (e.g., item 10 and item 18 may together form a fabric-based item such as a wristwatch with a strap). In still other situations, item 10 may be an electronic device, fabric 12 may be used in forming the electronic device, and additional items 18 may include accessories or other devices that interact with item 10. Signal paths formed from conductive yarns and monofilaments may be used to route signals in item 10 and/or item(s) 18.

The fabric that makes up item 10 may be formed from yarns and/or monofilaments that are intertwined using any suitable intertwining equipment. With one suitable arrangement, which may sometimes be described herein as an example, fabric 12 may be woven fabric formed using a weaving machine. In this type of illustrative configuration, fabric may have a plain weave, a basket weave, a satin weave, a twill weave, or variations of these weaves, may be a three-dimensional woven fabric, or may be other suitable fabric.

Figure 2:
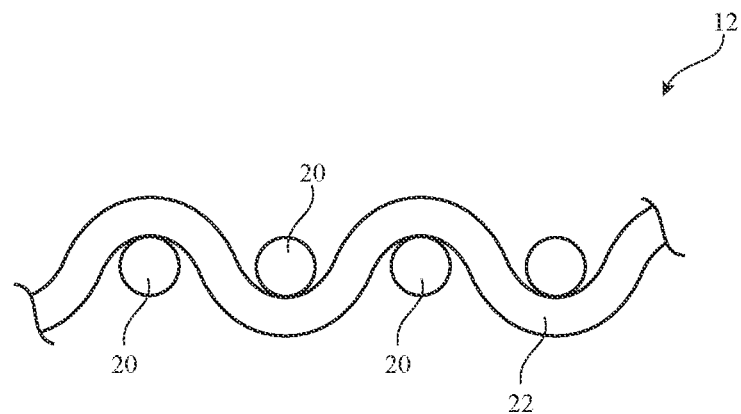
FIG. 2 is a side view of illustrative fabric in accordance with an embodiment.

A cross-sectional side view of illustrative woven fabric 12 is shown in FIG. 2. As shown in FIG. 2, fabric 12 may include yarns or other strands of material such as warp yarns 20 and weft yarns 22. In the illustrative configuration of FIG. 2, fabric 12 has a single layer of woven yarns. Multi-layer fabric constructions may be used for fabric 12 if desired.

Figure 3:
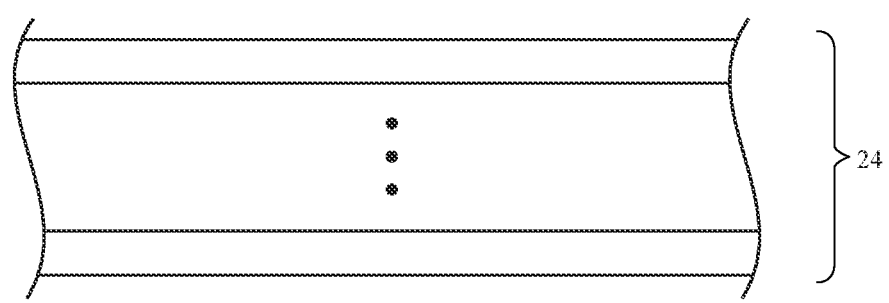
FIG. 3 is a side view of layers of material that may be incorporated into a fabric-based item in accordance with an embodiment.

Fabric-based item 10 may include non-fabric materials (e.g., structures formed from plastic, metal, glass, ceramic, crystalline materials such as sapphire, etc.). These materials may be formed using molding operations, extrusion, machining, laser processing, and other fabrication techniques. In some configurations, some or all of fabric-based item 10 may include one or more layers of material such as layers 24 of FIG. 3. Layers 24 may include layers of polymer, metal, glass, fabric, adhesive, crystalline materials, ceramic, substrates on which components have been mounted, patterned layers of material, layers of material containing patterned metal traces, thin-film devices such as transistors, and/or other layers.

Figure 4:
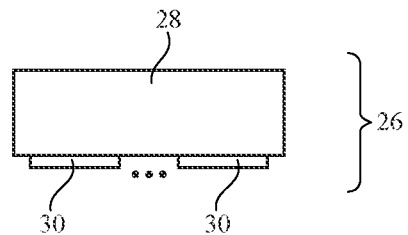
FIG. 4 is a cross-sectional side view of an illustrative electrical component in accordance with an embodiment.

A side view of an illustrative electrical component of the type that may be used in fabric-based item 10 is shown in FIG. 4. Electrical components in item 10 such as illustrative electrical component 26 of FIG. 4 may include discrete electrical components such as resistors, capacitors, and inductors, may include connectors, may include input-output devices such as switches, buttons, light-emitting components such as light-emitting diodes, audio components such as microphones and speakers, vibrators (e.g., piezoelectric actuators that can vibrate), solenoids, electromechanical actuators, motors, and other electromechanical devices, microelectromechanical systems (MEMs) devices, pressure sensors, light detectors, proximity sensors (light-based proximity sensors, capacitive proximity sensors, etc.), force sensors (e.g., piezoelectric force sensors), strain gauges, moisture sensors, temperature sensors, accelerometers, gyroscopes, compasses, magnetic sensors (e.g., Hall effect sensors and magnetoresistance sensors such as giant magnetoresistance sensors), touch sensors, and other sensors, components that form displays, touch sensors arrays (e.g., arrays of capacitive touch sensor electrodes to form a touch sensor that detects touch events in two dimensions), and other input-output devices, electrical components that form control circuitry such as non-volatile and volatile memory, microprocessors, application-specific integrated circuits, system-on-chip devices, baseband processors, wired and wireless communications circuitry, and other integrated circuits. Electrical components such as component 26 may be bare semiconductor dies (e.g., laser dies, light-emitting diode dies, integrated circuits, etc.) or packaged components (e.g. semiconductor dies or other devices packaged within plastic packages, ceramic packages, or other packaging structures). One or more electrical terminals such as contact pads 30 may be formed on body 28 of component 26. Body 28 may be a semiconductor die (e.g., a laser die, light-emitting diode die, integrated circuit, etc.) or may be a package for a component (e.g., a plastic package or other dielectric package that contains one or more semiconductor dies or other electrical devices). Contacts for body 28 such as pads 30 may be protruding leads, may be planar contacts, may be formed in an array, may be formed on any suitable surfaces of body 28, or may be any other suitable contacts for forming electrical connections to component 26. For example, pads 30 may be metal solder pads.

Figure 5:
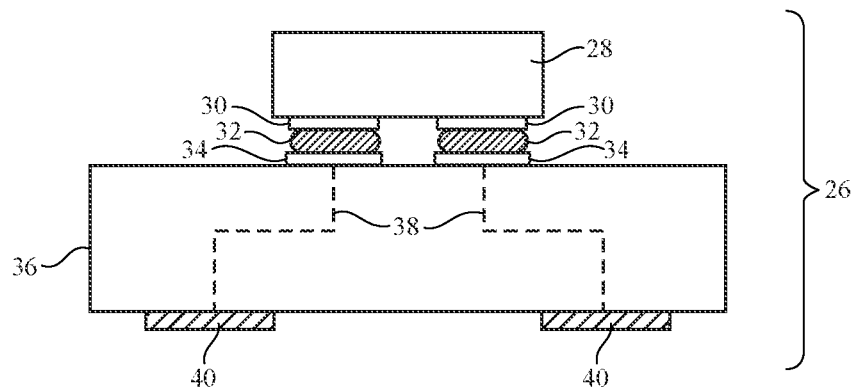
FIG. 5 is a cross-sectional side view of an illustrative electrical component having an electrical device mounted on an interposer in accordance with an embodiment.

As shown in the example of FIG. 5, body 28 may be mounted on a support structure such as interposer 36. Interposer 36 may be a printed circuit, ceramic carrier, or other dielectric substrate. Interposer 36 may be larger than body 28 or may have other suitable sizes. Interposer 36 may have a planar shape with a thickness of 700 microns, more than 500 microns, less than 500 microns, or other suitable thickness. The thickness of body 28 may be 500 microns, more than 300 microns, less than 1000 microns, or other suitable thickness. The footprint (area viewed from above) of body 28 and interposer 36 may be 10 microns×10 microns, 100 microns×100 microns, more than 1 mm×1 mm, less than 10 mm×10 mm, may be rectangular, may be square, may have L-shapes, or may have other suitable shapes and sizes.

Interposer 36 may contain signal paths such as metal traces 38. Metal traces 38 may have portions forming contacts such as pads 34 and 40. Pads 34 and 40 may be formed on the upper surface of interposer 36, on the lower surface of interposer 36, or on the sides of interposer 36. Conductive material such as conductive material 32 may be used in mounting body 28 to interposer 36. Conductive material 32 may be solder (e.g., low temperature or high temperature solder), may be conductive adhesive (isotropic conductive adhesive or anisotropic conductive film), may be formed during welding, or may be other conductive material for coupling electrical device pads (body pads) such as pads 30 on body 28 to interposer pads 34. Metal traces 38 in interposer 36 may couple pads 34 to other pads such as pads 40. If desired, pads 40 may be larger and/or more widely spaced than pads 34, thereby facilitating attachment of interposer 36 to conductive yarns and/or other conductive paths in item 10. Solder, conductive adhesive, or other conductive connections may be used in coupling pads 40 to conductive yarn, conductive monofilament, printed circuit traces, or other conductive path materials in fabric-based item 10.

Figure 6:
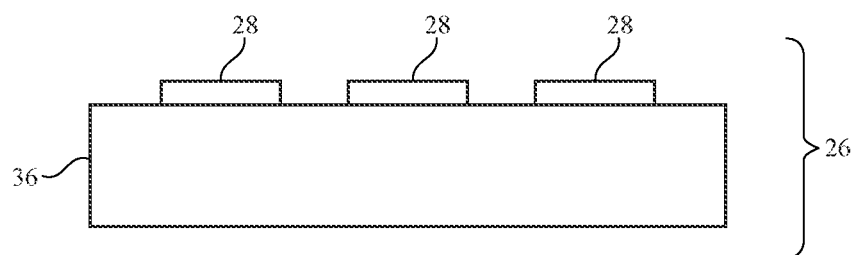
FIG. 6 is a cross-sectional side view of an illustrative electrical component having multiple electrical devices mounted on an interposer in accordance with an embodiment.

FIG. 6 shows how interposer 36 may be sufficiently large to accommodate multiple electrical devices each with a respective body 28. For example, multiple light-emitting diodes, sensors, and/or other electrical devices may be mounted to a common interposer such as interposer 36 of FIG. 6. The light-emitting diodes may be micro-light-emitting diodes (e.g., light-emitting diode semiconductor dies having footprints of about 10 microns×10 microns, more than 5 microns×5 microns, less than 100 microns×100 microns, or other suitable sizes). The light-emitting diodes may include light-emitting diodes of different colors (e.g., red, green, blue, white, etc.), infrared light, or ultraviolet light. Redundant light-emitting diodes or other redundant circuitry may be included on interposer 36. In configurations of the type shown in FIG. 6 in which multiple electrical devices (each with a respective body 28) are mounted on a common interposer, electrical component 26 may include any suitable combination of electrical devices (e.g., light-emitting diodes, sensors, integrated circuits, actuators, and/or other devices of the type described in connection with electrical component 26 of FIG. 4).

Figure 7:
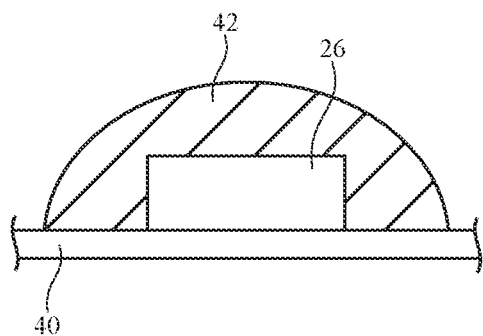
FIG. 7 is a cross-sectional side view of an illustrative electrical component mounted on a substrate and covered with a bead of polymer in accordance with an embodiment.

Electrical components may be coupled to fabric structures, individual yarns or monofilaments, printed circuits (e.g., rigid printed circuits formed from fiberglass-filled epoxy or other rigid printed circuit board material or flexible printed circuits formed from polyimide substrate layers or other sheets of flexible polymer materials), metal or plastic parts with signal traces, or other structures in item 10. In the configuration of FIG. 7, component 28 has been mounted to support structure 40 (e.g., a layer of fabric, a printed circuit, etc.).

It may be desired to cover component 26 with one or more layers of material. For example, in configurations in which component 26 is sensitive to moisture, it may be desirable to seal component 26 within a waterproof material. In configurations in which component 26 emits light, it may be desirable to cover component 26 with a light-diffusing layer such as a polymer layer including metal oxide particles (e.g., white particles of titanium dioxide), other inorganic particles, organic particles, colored particles, or other light-diffusing particles. Opaque materials and/or materials with other optical, mechanical, and/or electrical properties may also be used to cover some or all of component 26. In the illustrative configuration of FIG. 7, a bead of polymer such as polymer 42 has been used to cover component 26 and an adjacent portion of the upper surface of support structure 40. Polymer 42 may be, for example, a light-diffusing material such as a white potting compound (e.g., a polymer with white light scattering particles). Other materials may be used to cover electrical components on support structure 40 if desired. The configuration of FIG. 7 in which a bead of light-diffusing polymer has been used to cover electrical component 26 is merely illustrative.

Figure 8:
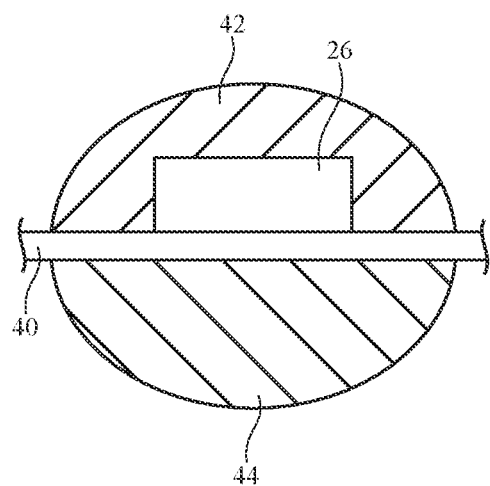
FIG. 8 is a cross-sectional side view of an illustrative electrical component that is covered with a bead of polymer such as a translucent polymer and that overlaps a bead of polymer such as an opaque polymer bead in accordance with an embodiment.

FIG. 8 shows how beads of polymer or other materials may be formed above and below component 26. Upper bead 42 may cover component 26 and adjacent portions of support structure 40. Lower bead 44 may cover the rear of support structure 40 under component 26. With one illustrative arrangement, support structure 40 of FIG. 8 is a flexible substrate layer (e.g., a flexible printed circuit layer), upper bead 42 is a light-diffusing bead of polymer, and lower bead 44 is an opaque (e.g., black) bead of light-absorbing polymer. Bead 42 may help diffuse and homogenize light emitted by component 26 in the upwards direction and bead 44 may help to block stray light that might otherwise propagate in the downwards direction (in the orientation of FIG. 8).

The surface of support structure 40 to which bead 42 is attached may sometimes be referred to as a top surface, front surface, or outer surface of structure 40 and the surface of structure 40 to which bead 44 is attached may sometimes be referred to as a bottom surface, rear surface, or inner surface of structure 40. Arrangements in which an opaque bead of polymer is formed on an outer surface of structure 40 and a translucent bead of polymer is formed on the inner surface (backside) of structure 40 may be used, if desired. The configuration of FIG. 8 is presented as an example. If desired, beads of polymer or other material may be used to encapsulate component 26 and thereby protect component 26 from moisture, dust, and other contaminants, to help adhere component 26 to support structure 40, etc.

Figure 9:
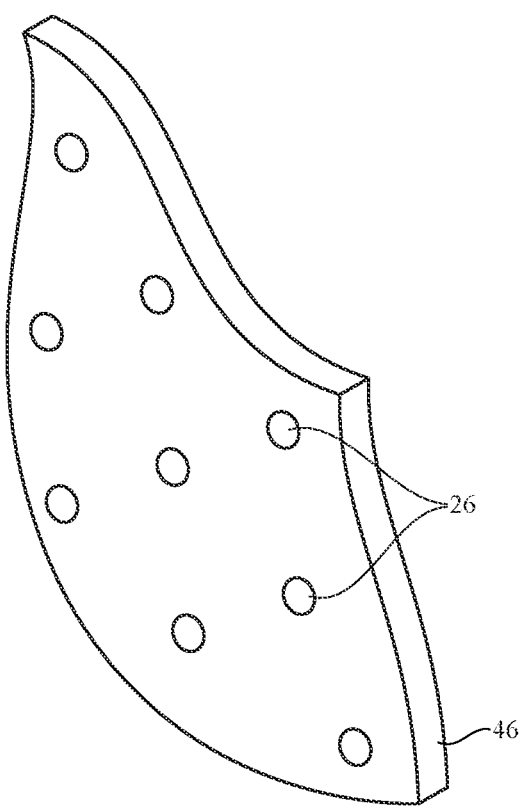
FIG. 9 is a perspective view of a layer of material in a fabric-based item that includes an array of electrical components in accordance with an embodiment.

One or more electrical components 26 may be included in item 10. In some configurations, housing walls, interior housing structures, planar layers of material, and/or other layers of material may be provided with multiple components 26. As shown in FIG. 9, for example, structure 46 may be provided with an array of electrical components 26. Structure 46 may include a support structure such as support structure 40 of FIGS. 7 and 8 (or may be a structure such as support structure 40). Components 26 may be arranged in a two-dimensional array (e.g., an array having rows and columns), may be arranged in a pseudo-random pattern, may be arranged in circles, lines, or triangles, or other shapes, or may be organized in other patterns. Structure 46 may be flexible and stretchable and may include outer layers of fabric or other materials. Structure 46 may be used in forming a wall for a bag, a portion of a strap, a layer in a piece of clothing or other item, or other portion of fabric-based item 10.

Components 26 may be mounted on the outermost surface of structure 46, or may be mounted in an interior portion of structure 46. For example, structure 46 may include multiple layers of material (plastic layers, printed circuit layers, adhesive layers, fabric layers, etc.). In this type of arrangement, structure 46 may include window structures in alignment with components 26. For example, structure 46 may include an array of light-transparent windows (partially transparent windows, translucent windows, etc.) in a configuration in which components 26 are light-emitting diodes or other light sources and/or are light detectors. As another example, components 26 may be antennas or other components that use radio-frequency electromagnetic signals. In this type of arrangement, structure 46 may include radio-transparent windows (e.g. windows formed from plastic or other dielectric that allows radio-frequency signals to pass). In configurations in which electrical components 26 are temperature sensors, the windows in structure 46 may be thermally conductive windows that allow temperature measurements to be made by components 26. Windows may be circular, square, may form part of elongated shapes (e.g., strips of window material), may have shapes with combinations of curved and straight sides, and/or may have other suitable shapes. Configurations for structure 46 in which structure 46 has a uniform appearance (with no discernable windows) may also be used (e.g., by providing all of a fabric layer or other outer layer in structure 46 with appropriate light-transmission properties, radio-transparency properties, and/or thermal conductivity properties or other properties that are compatible with components 26).

Figure 10:
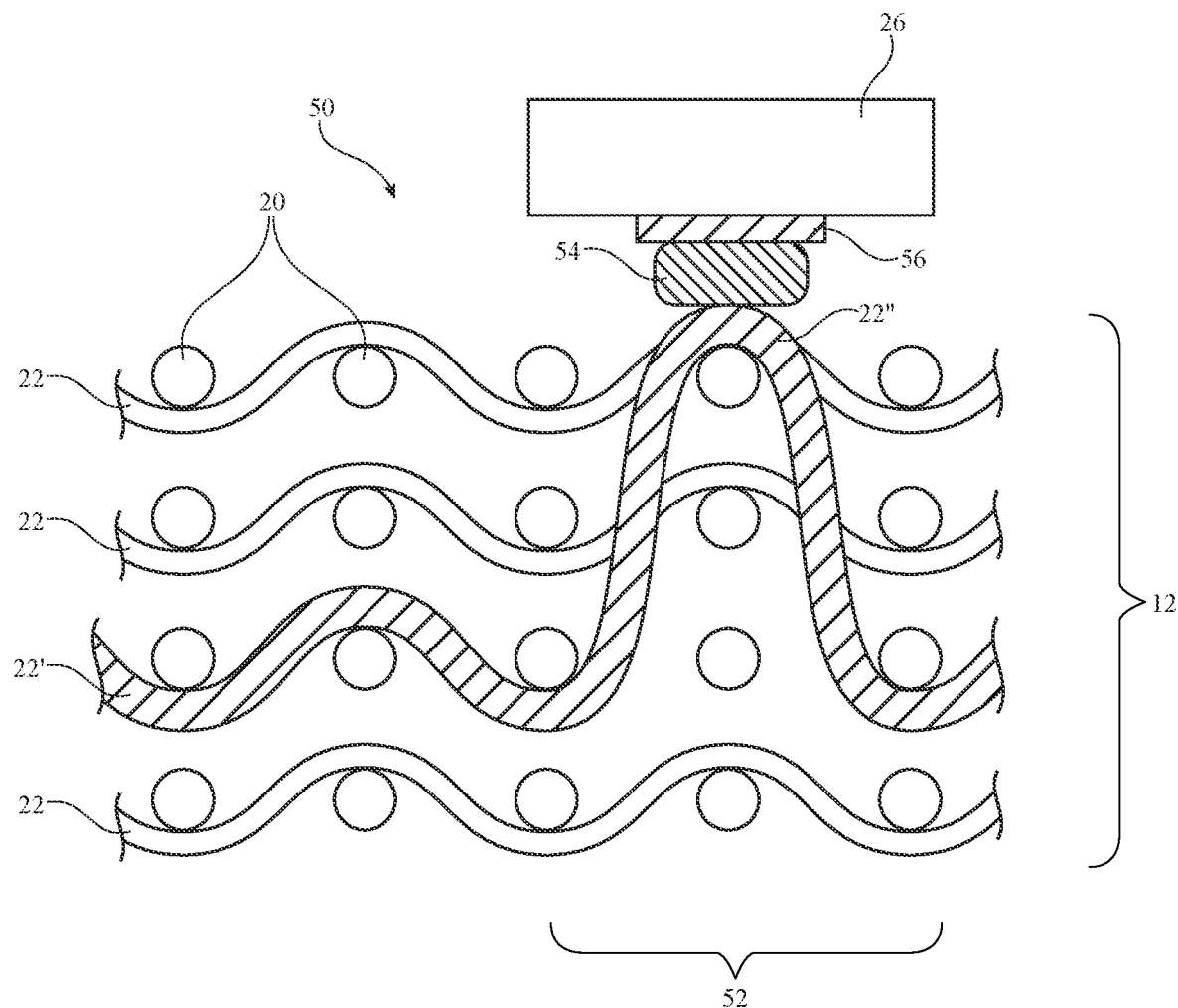
FIG. 10 is a cross-sectional side view of an illustrative fabric layer showing how a conductive strand of material such as a conductive yarn may be selectively brought to the surface of the fabric layer and used to form a contact such as a solder pad for coupling to an electrical component in accordance with an embodiment.
Figure 11:
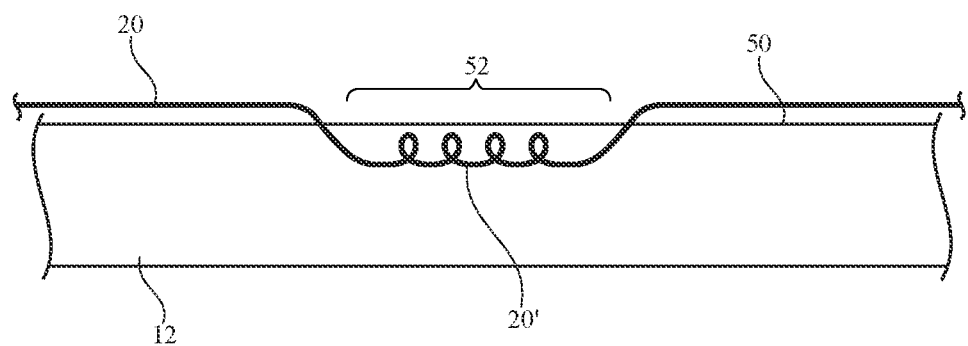
FIG. 11 is a cross-sectional side view of an illustrative layer of fabric having an area into which extra strands of material such as floating conductive warp yarns are being incorporated to form a contact such as a solder pad in accordance with an embodiment.

In some configurations, item 10 may include electrical connections between components 26 and conductive paths in fabric 12. Fabric 12 may include conductive yarns and/or conductive monofilaments for carrying signals. The yarns and/or monofilaments may be used to form fabric contact pads. Consider, as an example, fabric 12 of FIG. 10. As shown in FIG. 10, fabric 12 may contain strands of material such as warp yarns 20 and weft yarns 22. One or more of these yarns may be conductive and may be exposed on the surface of fabric 12 to form a contact pad. In the example of FIG. 10, conductive yarn 22' has been woven in a pattern that causes portion 22" of yarn 22' to form a contact pad on upper surface 50 of fabric layer 12 in region 52. Component 26 may have contact pads such as pad 56. Solder or other conductive material 54 may be used to couple pad 56 to the pad formed by portion 22" of yarn 22'. In the illustrative configuration of FIG. 10, pad 22' has been formed by selectively raising weft yarn 22' to surface 50 in region 52 (e.g., using a three-dimensional weaving machine). If desired, warp yarns or other suitable strands of material in fabric 12 may be used to form contact pad 22'. As shown in FIG. 11, for example, portion 20' of floating warp yarn 20 may be used in forming a contact pad on surface 50 of fabric 12 (and remaining portions of yarn 20 may be trimmed away). Embossing techniques (e.g., techniques for incorporating conductive yarns into fabric 12 using sewing equipment) may also be used to form fabric contact pads in fabric 12. If desired, transparent yarns or yarns having other desired properties may likewise be patterned to form surface structures such as pad 22' of FIG. 11 (e.g., to from transparent windows for underlying components 26). The use of weaving techniques and other patterning techniques to form solder pads is merely illustrative.

Figure 12:
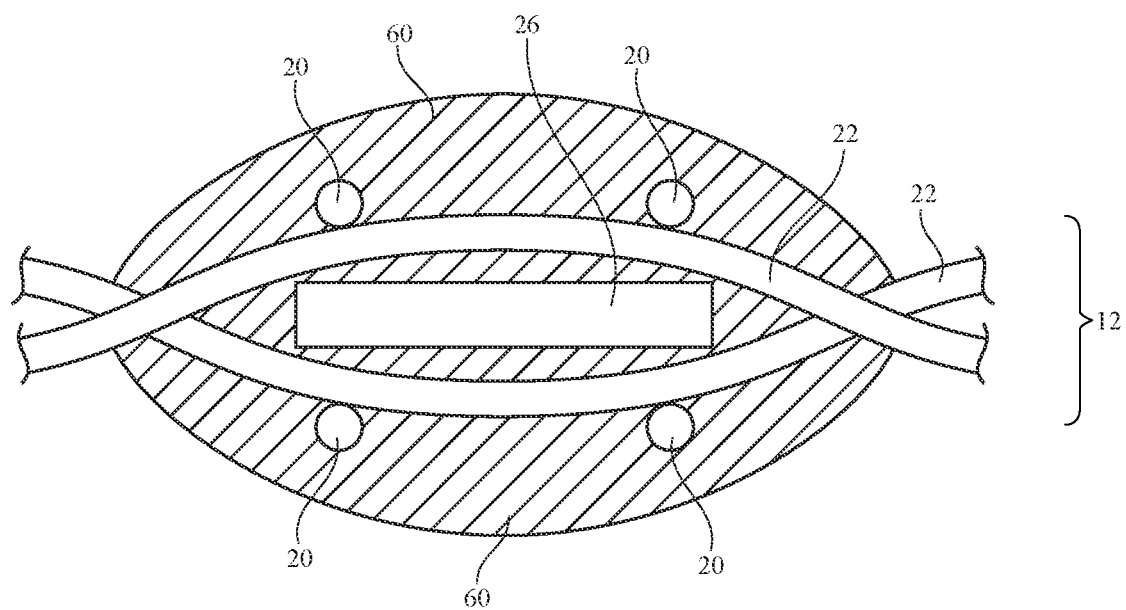
FIG. 12 is a cross-sectional side view of an illustrative component that has been incorporated into fabric in accordance with an embodiment.

As shown in FIG. 12, components 26 may be mounted within fabric 12. In the example of FIG. 12, component 26 has been inserted into fabric 12 during the process of forming fabric 12 (e.g., during fabric weaving, knitting, braiding, etc.). Yarns such as yarns 22 and 20 may surround component 26 (e.g., yarns may extend over and under component 26 and/or may extend along some or all of the four edges of component 26). This helps secure component 26 within fabric 12. If desired, a bead or layer of material such as material 60 may be formed over the upper and/or lower portions of component 26 and the yarns adjacent to component 26. Optional material 60 may be, for example, a layer of clear polymer, other polymer, or other materials (see, e.g., polymer beads 42 and/or 44 of FIG. 8). Material 60 may help diffuse light emitted by component 26 and may protect component 26 from dust and moisture.

In some configurations, it may be desirable to form conductive connections between fabric 12 and component 26 using solder. Polymer yarns that are insensitive to elevated temperatures may be used to help ensure that fabric 12 is not damaged during soldering. Inductive soldering techniques can also be used when forming soldering connections. With inductive soldering, energy from an inductive soldering tool is deposited primarily in the solder material that is being melted, so temperature rises in nearby polymer yarns can be minimized.

Figure 13:
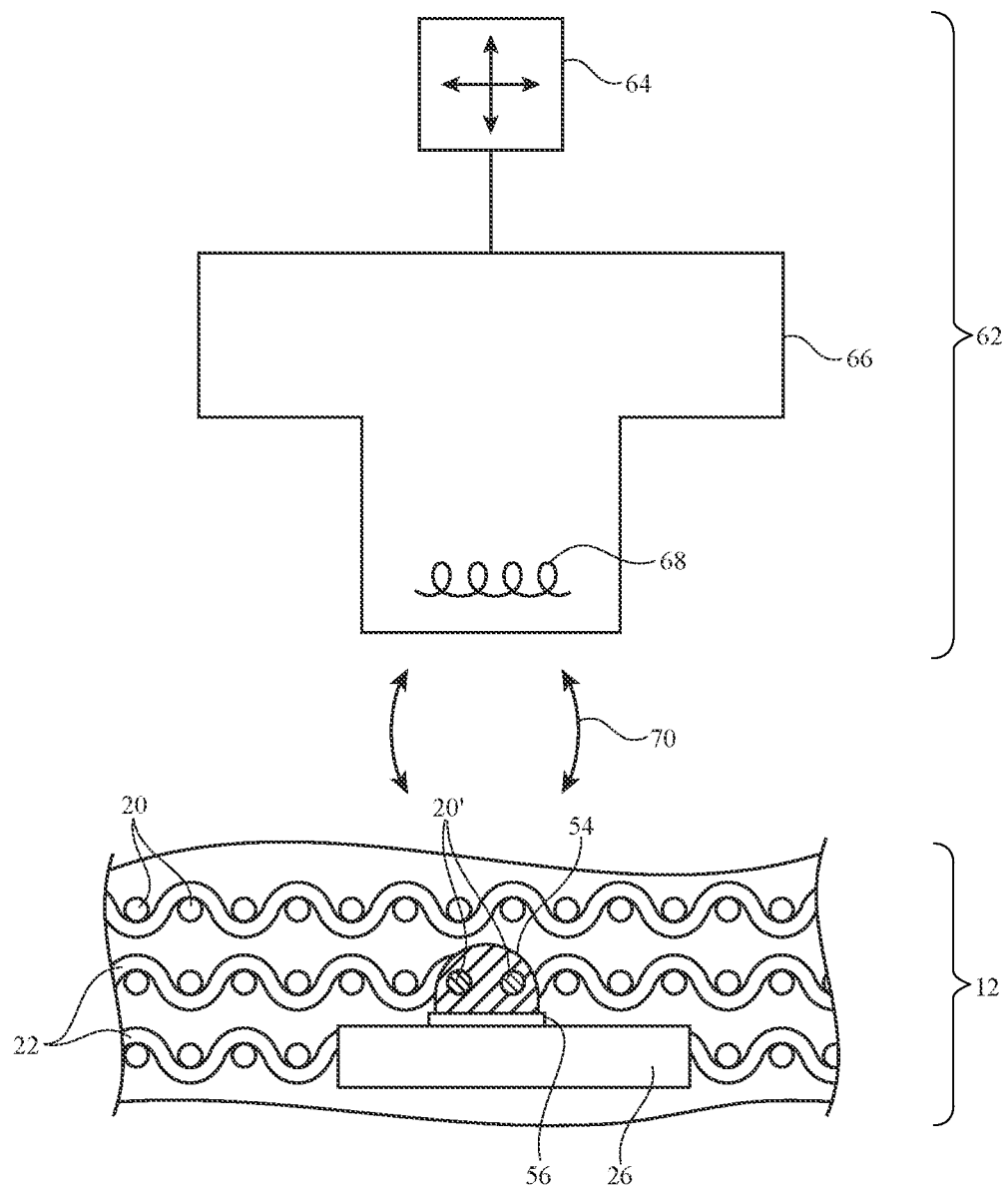
FIG. 13 is a side view of an illustrative inductive soldering tool being used to solder an electrical component to conductive structures in a fabric in accordance with an embodiment.

FIG. 13 is a diagram of an illustrative inductive soldering system. In the example of FIG. 13, a solder connection is being formed between a conductive path in fabric 12 and component 26 using inductive soldering tool 62. Fabric 12 has warp yarns 20 and weft yarns 22. Solder 54 is being melted by inductive soldering tool 62 and is being used to electrically and mechanically couple conductive warp yarns 20' to contact pad 56 of component 26. Component 26 has been embedded within fabric 12 (e.g., by inserting component 26 into a pocket formed in fabric 12 during weaving or formed during other yarn intertwining operations. Some yarns in fabric 12 may be sensitive to heat, so it may be desirable to avoid excessively raising the temperature of fabric 12 during soldering operations. The use of yarns that are compatible with elevated temperatures and the use of inductive soldering can help avoid damage to fabric 12 during soldering.

Inductive soldering tool 62 may include inductive soldering head 66. Head 66 may have an inductor such as inductor 68 or other structure for emitting electromagnetic signals (signals 70 of FIG. 13) that are electromagnetically coupled to solder 54. When inductor 68 is powered, energy from inductor 68 may be coupled into solder 54 to melt solder 54 as shown by electromagnetic signals 70.

Computer-controlled positioner 64 may be used to adjust the position of head 66 relative to fabric 12 and solder 54. Solder 54 may initially be deposited in the form of screen-printed solder paste on solder pads 56 of component 26. During the process of weaving or otherwise forming fabric 12, a pocket or other structures may be formed in fabric 12 that helps fabric 12 receive electrical components 26 and that helps align solder pads 56 and the solder paste (or other form of solder) on solder pads 56 with conductive structures in fabric 12 such as illustrative conductive yarns 20' of FIG. 13. The pocket in fabric 12 may be formed by omitting layers of fabric from internal portions of fabric layer 12, thereby forming a pocket having a shape and size appropriate to receive component 26.

The yarns in fabric 12 may be used to hold component 26 in place in an orientation in which conductive yarns 20' overlap solder pad 56 and solder 54 while inductive soldering tool 62 melts solder 54 and forms a solder joint between conductive yarns 20' and solder pad 56 of component 26. Conductive yarns 20' may be metal strands of material coated with a thin plastic coating that melts away when contacted by molten solder. When solder 54 is in its molten state, solder 54 may be more attracted to the metal of yarns 20' (due to the affinity of solder for metal) than the polymer of adjacent insulating yarns 22 and 20, thereby helping to localize the solder joint. This localization of the solder joint formed by solder 54 may prevent excessive heating of adjacent polymer yarns in fabric 12.

Figure 14:
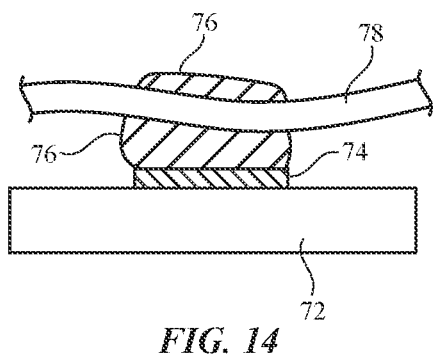
FIG. 14 is a cross-sectional side view of a conductive yarn being coupled to a solder pad using solder in accordance with an embodiment.
Figure 15:
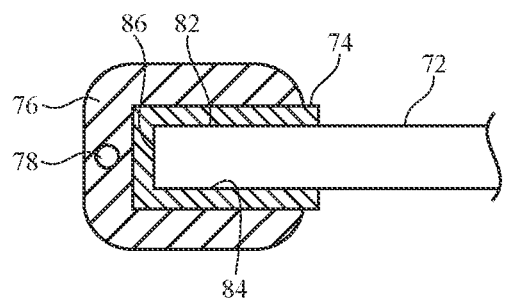
FIG. 15 is a cross-sectional side view of a conductive yarn being coupled to an edge-plated structure with solder in accordance with an embodiment.
Figure 16:
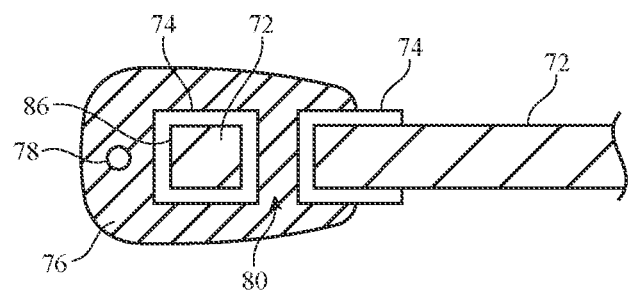
FIG. 16 is a cross-sectional side view of an illustrative conductive yarn being coupled with solder to a contact that protrudes through a substrate opening to help hold the solder in place in accordance with an embodiment.

In the illustrative configurations of FIGS. 14, 15, and 16, solder 76 (e.g., inductively melted solder) is being coupled to solder pad 74 on structure 72. Structure 72 may be a printed circuit substrate to which component 26 is mounted, may be an interposer in an electrical component, or may be an electronic device (e.g., a semiconductor die) in an electrical component.

In the configuration of FIG. 14, conductive yarn 78 overlaps pad 74 and is coupled to pad 74 by solder 76. Pad 74 may have a rectangular footprint or other suitable shapes and may be formed on an upper surface, lower surface, or edge surface of structure 72.

FIG. 15 shows how structure 72 may be provided with a solder pad formed using edge plating or other metal deposition techniques that at least partly cover a vertical edge surface of structure 72 with metal. In edge plating arrangements, metal for solder pad 74 may be electroplated onto a peripheral portion of upper surface 82 of structure 72, lower surface 84 of structure 72, and peripheral edge surface 86 of structure 72. Conductive yarn 78 may be captured within solder 76.

In the arrangement of FIG. 16, opening 80 has been formed in structure 72. Opening 72 may be, for example, a mechanically drilled or laser drilled via in a printed circuit or other opening in structure 72. Edge plating techniques may be used to form contact pad structures 74 in opening 80, on the opposing upper and lower peripheral surfaces of structure 72, and on peripheral edge surface 86. Inductive soldering techniques or other soldering techniques (e.g., techniques involving application of heat to solder 76 using a hot bar or reflow oven), may be used to melt solder 76 and thereby cause molten solder 76 to penetrate into opening 80. When solder 76 cools and solidifies, the portion of solder 76 in opening 80 will form a mechanical interlock that makes it difficult to dislodge solder 76. Conductive yarn 78 that is soldered to pad 74 in this way may be resistant to becoming dislodged due to the enhanced engagement between solder 76 and structure 72.

Figure 17:
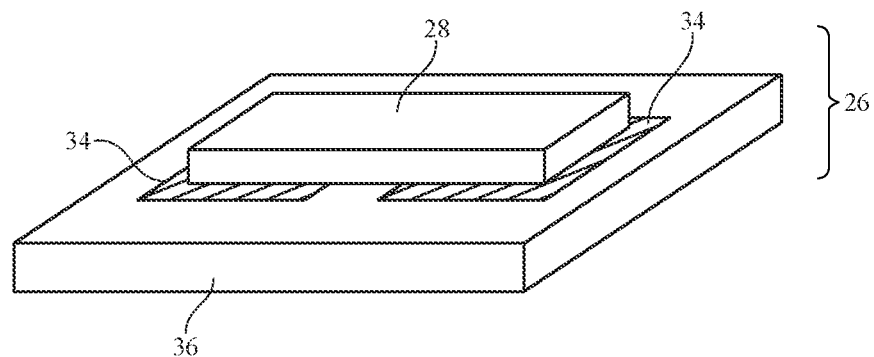
FIG. 17 is a perspective view of an illustrative electrical component formed from an electrical device mounted to an interposer in accordance with an embodiment.
Figure 18:
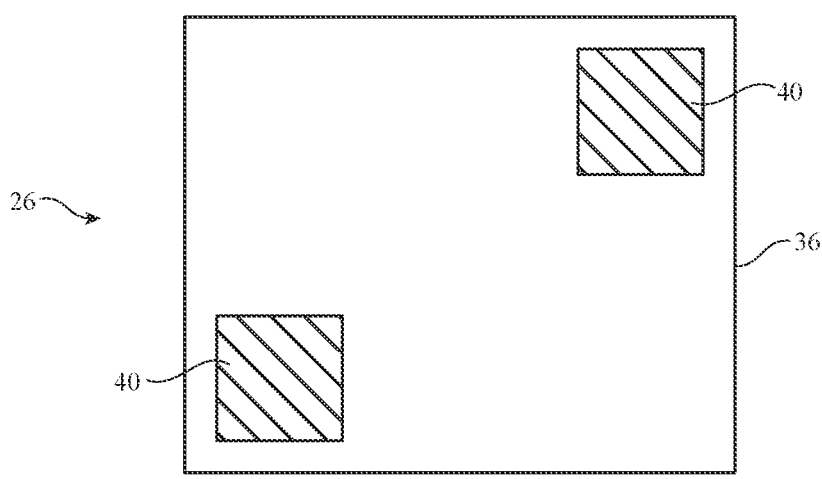
FIG. 18 is a rear view of the interposer of FIG. 17 in accordance with an embodiment.

Solder pad arrangements of the type shown in FIGS. 14, 15, and 16 may be used for support structure 40 (e.g., a printed circuit to which one or more components 26 have been mounted), may be used for interposer 36, and/or may be used for coupling conductive yarn or other conductive structures in fabric 12 to body 28 (e.g., an electrical device such as a semiconductor die, etc.). FIG. 17 is a perspective view of component 26 in an illustrative configuration in which body 28 of an electrical device has been soldered to pads 34 on the upper surface of interposer 36. FIG. 18 is a rear view of interposer 36 of FIG. 17. Metal traces 38 (see, e.g., FIG. 5) may be coupled to corresponding solder pads on the lower surface of interposer 36 such as solder pads 40 of FIG. 18. In the example of FIG. 18, solder pads 18 have been located on diagonally opposed corners of the rear surface of interposer 36. Other configurations for mounting semiconductor dies and other electrical devices on interposer 36 and in using metal traces 38 to couple these devices to solder pads 40 may be used, if desired.

Figure 19:
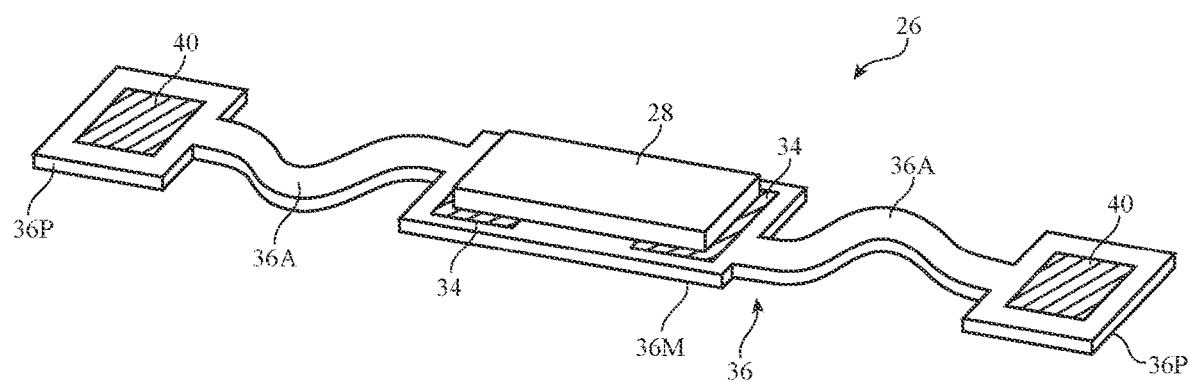
FIG. 19 is a perspective view of an illustrative electrical component having an electrical device mounted to a flexible substrate having serpentine arms in accordance with an embodiment.

FIG. 19 is a perspective view of an illustrative flexible interposer arrangement. In the FIG. 19 arrangement, interposer 36 has been formed from a flexible printed circuit substrate (i.e., a flexible layer of polyimide or other flexible polymer layer). Metal traces 38 in interposer 36 may be used to couple solder pads 34 to respective solder pads 36P. Interposer 36 may have serpentine arms such as arms 36A that couple main interposer region 36M to solder pad interposer regions 36P. The user of serpentine shapes for arms 36A may help allow the arms 36A to flex and stretch to accommodate movement of interposer 36 within a fabric layer or other stretchable layer without damaging the metal traces within interposer 36. In general, any suitable arm shapes (e.g., straight segments, sinusoidal serpentine segments, horseshoe-shaped segments, zig-zag shapes, etc.) may be used for arms 36A. Interposer 36 may have any suitable number of elongated arm structures (e.g., one arm, two or more arms, three or more arms, four or more arms, etc.).

Solder pads 34 may be formed on the upper surface of interposer 36 in region 36M. Inductive soldering operations with inductive soldering tool 62 (FIG. 13) may be used to solder contact pads on body 28 to solder pads 34. Solder pads 40 may be soldered to conductive yarns in fabric 12 using inductive soldering tool 62.

Figure 20:
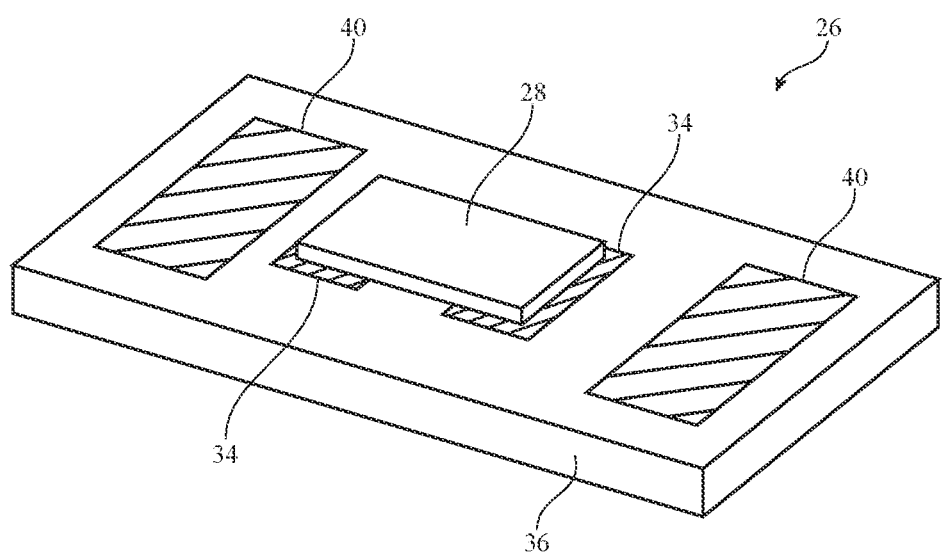
FIG. 20 is a perspective view of an illustrative electrical component having an electrical device mounted to an interposer that has an upper surface with exposed contact pads flanking the electrical device in accordance with an embodiment.

In the example of FIG. 20, body 28 has been soldered to pads 34 in the center of interposer 36. Metal traces 38 in interposer 36 may be used to couple pads 34 to respective solder pads 40. In the illustrative arrangement of FIG. 20, there is one electronic device body 28 (e.g., a single semiconductor die for a light-emitting diode or other electrical device). Additional electrical device bodies 28 may be soldered to interposer 36, if desired (e.g., to provide redundant light-emitting diodes, to provide light-emitting diodes of other colors, to incorporate one or more sensors, actuators, and/or other devices on the same interposer as one or more light-emitting diodes, etc.). Solder pads 40 may be formed on the upper surface of interposer 36 (as shown in FIG. 20) or may be formed on the rear and/or side surfaces of interposer 36.

Figure 21:
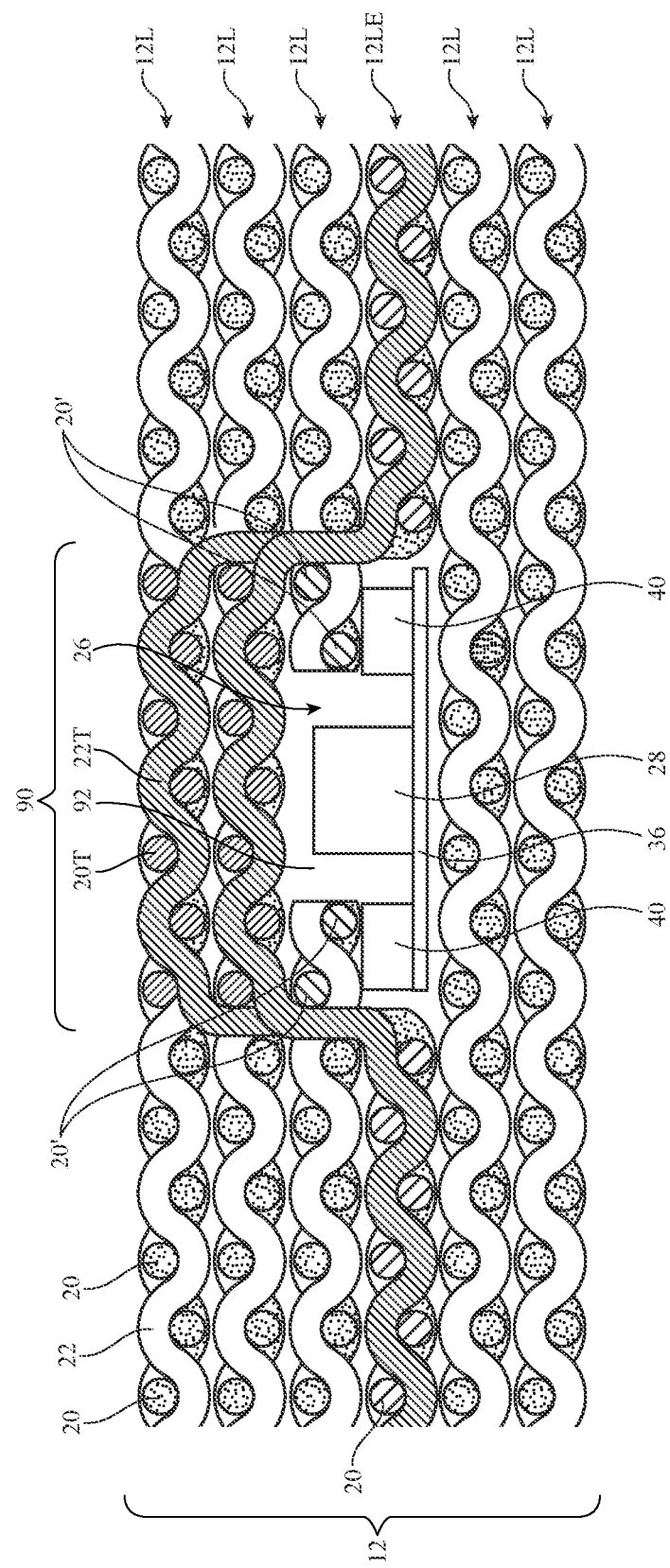
FIG. 21 is a cross-sectional side view of illustrative fabric in which a pocket has been formed in accordance with an embodiment.

A cross-sectional side view of a portion of fabric 12 into which a component such as illustrative component 26 of FIG. 20 has been mounted is shown in FIG. 21. As shown in FIG. 21, component 26 may have a semiconductor die or other electrical device with a body 28 that is soldered to the upper surface of substrate 36. Pads 40 may be interconnected with solder pads under body 28 using metal traces in substrate 36. Fabric 12 may have multiple layers 12L. Each layer may have warp yarns 20 and weft yarns 22. Yarns 20 and 22 may be formed from polymer or other suitable materials. Conductive yarns in fabric 12 such as conductive yarns 20' may form signal paths in fabric 12.

Component 26 may be embedded within fabric 12 by mounting component 26 within a pocket (cavity) in fabric 12 such as pocket 92. Pocket 92 may be formed during weaving operations (or other fabric assembly operations) and component 26 may be mounted in pocket 92 during weaving operations (or other fabric assembly operations). Pocket 92 may be formed by changing the architecture of the fabric using two or more of fabric layers 12L. Pocket 92 may help orient component 26 so that solder pads 40 (and solder paste on pads 40) are aligned with respective conductive yarns 20'. During operation of item 10, conductive yarns 20' may carry signals between component 26 and other circuitry in item 10.

Conductive yarns 20' may be metal-coated polymer yarns, metal wires, or other conductive yarns. With one illustrative arrangement, each yarn 20' may include multiple monofilaments of polymer core material surrounded by a conductive coating and covered with a thin outer polymer layer that is melted away during soldering operations. Other conductive yarns may be used in forming signal paths for fabric 12, if desired.

If desired, component 26 may emit and/or detect light. To permit light to pass through the upper portions of fabric 12, at least some of the yarns in fabric 12 may be formed from transparent material (e.g., transparent polymer, translucent material that allows light to pass while diffusing the light, etc.). As an example, warp yarns 20T and weft yarn 22T may be formed from transparent polymer. In window regions such as region 90 that are aligned with respective components 26, transparent weft yarns 22T may be brought to the surface of fabric 12 from buried layer 12LE, as shown in FIG. 21 (i.e., transparent yarn 22T may be used in forming the uppermost one, two, or more than two of layers 12L in region 90). Transparent warp yarns 20T may also be woven into this portion of fabric 12 in region 90. In this way, a transparent window may be formed above each pocket 92 and its associated light-based component 26. The remainder of fabric 12 may be formed from opaque yarns (e.g., colored yarns, white yarns, black yarns, or other yarns that block light).

In addition to forming optically transparent windows in fabric 12 (e.g., a window formed from transparent yarns 20T and 22T in region 90 of fabric 12 in the example of FIG. 21), yarns may be patterned in fabric 12 to form other types of windows (or to ensure that the upper layers 12L of fabric 12 have appropriate properties). These other types of windows may include, for example, regions in which fabric 12 is radio transparent (to support radio-frequency communications with overlapped radio-frequency components 26), regions in which the yarns of fabric 12 are loosely woven to facilitate the passage of sound, regions in which the yarns of fabric 12 have been selected to facilitate the passage of heat, near-field electromagnetic signals, or direct-current electric fields (e.g., to permit a capacitive touch sensor formed from components 26 to operate satisfactorily), regions in which the yarns of fabric 12 have been selectively configured to facilitate the transmission and/or reception of vibrations or other mechanical forces (e.g., to permit an actuator such as a piezoelectric vibrator to transmit vibrations through fabric 12 or to permit force input to be received by a button, force sensor, or strain gauge component), or regions in which the yarns of fabric 12 have been selectively configured to otherwise accommodate aligned electrical components 26.

Embossing techniques, floating warp yarn techniques, and other techniques may, if desired, be used in forming these fabric structures in region 90. There may be one electrical component 26 in each pocket 92 within fabric 12 or there may be an array of components 26 each of which is mounted within a respective pocket within fabric 12 (see, e.g., the array of components 26 in layer 46 of FIG. 9, which may be a layer of material such as fabric 12 of FIG. 21 or other fabric 12 having pockets (cavities) 92 for receiving components 26).

The foregoing is merely illustrative and various modifications can be made by those skilled in the art without departing from the scope and spirit of the described embodiments. The foregoing embodiments may be implemented individually or in any combination.

What is claimed is:

1. A fabric-based item comprising:
fabric having a pocket and having conductive paths; and
an electrical component embedded in the pocket, wherein the electrical component comprises an electronic device and an interposer comprising a substrate with opposing first and second surfaces, wherein the electronic device is mounted on the first surface of the substrate, and wherein the interposer further has pads on the first surface of the substrate that are coupled to the conductive paths.

2. The fabric-based item defined in claim 1 wherein the pads comprise solder pads and wherein the solder pads are soldered to the conductive paths.

3. The fabric-based item defined in claim 2 wherein the fabric has opaque yarns and has transparent yarns that are patterned to form a transparent window in the fabric that is aligned with the electrical component.

4. The fabric-based item defined in claim 3 wherein the electrical device is soldered to the interposer.

5. The fabric-based item defined in claim 4 wherein the electrical device comprises a semiconductor die.

6. The fabric-based item defined in claim 5 wherein the conductive paths comprise conductive yarns.

7. The fabric-based item defined in claim 6 wherein the interposer has first solder pads that are soldered to the solder pads of the electrical component and has second solder pads that are soldered to the conductive yarns.

8. The fabric-based item defined in claim 7 wherein the electrical device comprises a light-emitting diode.

9. The fabric-based item defined in claim 1 wherein the electrical device is a semiconductor die.

10. The fabric-based item defined in claim 1 wherein the electrical device comprises an actuator.

11. The fabric-based item defined in claim 1 wherein the electrical device comprises a sensor.

12. The fabric-based item defined in claim 1, wherein the substrate is a flexible printed circuit substrate having a main portion and a serpentine arm that extends from the main portion, wherein a first pad is coupled to the electronic device and is on the main portion adjacent to a first end of the serpentine arm, and wherein a second pad is coupled to one of the conductive paths and is on an opposing second end of the serpentine arm.

13. A fabric-based item comprising:
fabric having a pocket and having conductive paths; and
an electrical component that is mounted in the pocket in the fabric, wherein the electrical component comprises an electrical device that has contact pads and that is mounted on an interposer, wherein the interposer has first pads that are coupled to the conductive paths and has second pads that are coupled to the contact pads of the electrical device, and wherein the first pads and the second pads are on a same surface of the interposer.

14. The fabric-based item defined in claim 13 wherein the first pads comprise first solder pads that are soldered to the conductive paths and wherein the second pads comprise second solder pads that are soldered to the contact pads.

15. The fabric-based item defined in claim 13 wherein the electrical device comprises an actuator.

16. The fabric-based item defined in claim 13 wherein the electrical device comprises a sensor.

17. The fabric-based item defined in claim 13 wherein the electrical device comprises a semiconductor die.

18. The fabric-based item defined in claim 13, wherein the interposer comprises a flexible printed circuit substrate having a main portion and a serpentine arm that extends from the main portion, wherein one of the second pads is on the main portion adjacent to a first end of the serpentine arm, and wherein one of the first pads is on an opposing second end of the serpentine arm.

* * * * *